(12) United States Patent
Huening

(10) Patent No.: US 9,318,462 B1
(45) Date of Patent: Apr. 19, 2016

(54) SIDE WETTABLE PLATING FOR SEMICONDUCTOR CHIP PACKAGE

(71) Applicant: Maxim Integrated Products, Inc., San Jose, CA (US)

(72) Inventor: Kenneth J. Huening, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 65 days.

(21) Appl. No.: 14/171,054

(22) Filed: Feb. 3, 2014

Related U.S. Application Data

(62) Division of application No. 13/189,857, filed on Jul. 25, 2011, now Pat. No. 8,642,461.

(60) Provisional application No. 61/371,955, filed on Aug. 9, 2010.

(51) Int. Cl.
*H01L 21/44* (2006.01)
*H01L 23/00* (2006.01)
*H01L 21/48* (2006.01)

(52) U.S. Cl.
CPC ............ *H01L 24/29* (2013.01); *H01L 21/4825* (2013.01)

(58) Field of Classification Search
CPC .................................................. H01L 21/4825
USPC .................................................. 438/611–615
See application file for complete search history.

(56) References Cited

U.S. PATENT DOCUMENTS

| 5,751,068 | A | * | 5/1998 | McMahon | ........... B23K 3/0623 257/737 |
| 6,121,689 | A | * | 9/2000 | Capote et al. | .................. 257/783 |
| 6,260,264 | B1 | * | 7/2001 | Chen | ..................... H01L 21/563 174/260 |
| 6,911,720 | B2 | * | 6/2005 | Yamazaki et al. | ............ 257/678 |
| 7,955,953 | B2 | | 6/2011 | Lo et al. | |
| 2006/0012946 | A1 | | 1/2006 | Ishida et al. | |

FOREIGN PATENT DOCUMENTS

CN 101783246 7/2010

OTHER PUBLICATIONS

Quirk, Michael and Julian Serda, Semiconductor Manufacturing Technology, Prentice Hall, 2001, p. 324.

* cited by examiner

*Primary Examiner* — Mark Tornow
(74) *Attorney, Agent, or Firm* — Advent, LLP

(57) ABSTRACT

A method for providing a semiconductor chip package with side wettable plating includes singulating a semiconductor chip package from an array of packages formed in a block format, immersing the semiconductor chip package in a bath of plating solution, contacting a lead land of the semiconductor chip package with conductive contact material within the bath of plating solution, connecting the conductive contact material to a cathode electrical potential, connecting an anode within the bath of plating solution to an anode electrical potential, and plating the lead land of the semiconductor chip package.

14 Claims, 11 Drawing Sheets

SIDE WETTABLE PLATING FOR SEMICONDUCTOR CHIP PACKAGE

CROSS-REFERENCE TO RELATED APPLICATIONS

The present application is a divisional under 35 U.S.C. §120 of U.S. patent application Ser. No. 13/189,857, filed Jul. 25, 2011, and titled "SIDE WETTABLE PLATING FOR SEMICONDUCTOR CHIP PACKAGE," which claims priority under 35 U.S.C. §119(e) of U.S. Provisional Application Ser. No. 61/371,955, filed Aug. 9, 2010, and titled "Side Wettable Plating Method." U.S. patent application Ser. No. 13/189,857 and U.S. Provisional Application Ser. No. 61/371,955 are herein incorporated by reference in their entireties.

BACKGROUND

An ever present objective of semiconductor assembly is to provide packages for enclosing/encasing semiconductor components that are smaller, thinner, cooler, and less expensive to manufacture at a high rate of production. One type of semiconductor package is the Plastic Dual In-line Package (PDIP). Another type of semiconductor package is the gull-wing Small Outline (SO) package. These semiconductor packages generally include leads (connectors) extending from the sides of the package. Other types of semiconductor packages are flat lead-less packages, such as Dual Flat No-leads (DFN) and Quad Flat No-leads (QFN) packages. A DFN package has lead lands on only two sides of the perimeter of the package bottom, while a QFN package has lead lands on four sides of the package bottom. Some DFN and QFN package sizes can range from one millimeter by two millimeter (1×2 mm) packages having three (3) lead lands, to ten millimeter by ten millimeter (10×10 mm) packages having sixty-eight (68) lead lands.

Because the lead-frame is on the bottom of the package, flat no-lead packages can provide superior thermal performance when compared to leaded packages having similar body size and lead counts. Further, in a flat no-leads configuration, the die-attach-pad can be exposed on the bottom exterior of the package, allowing it to be soldered directly to a printed circuit board, and providing a direct route for heat to dissipate away from the package. The exposed die-attach-pad, often referred to as an exposed thermal pad, may greatly improve heat transfer out of the integrated circuit package and into the printed circuit board. However, when multiple flat no-lead packages are manufactured together and then separated from one another (singulated), it may be difficult to obtain good solder connections to lead lands located on side flanks of an IC package, because these side portions are not coated with solder wettable material prior to singulation. Further, it may be difficult to inspect solder connections to the lead lands using visual inspection techniques.

SUMMARY

Techniques for providing a semiconductor chip package with side wettable plating are disclosed. In one or more implementations, the techniques may include singulating a semiconductor chip package from an array of packages formed in a block format, immersing the semiconductor chip package in a bath of plating solution, contacting a lead land of the semiconductor chip package with conductive contact material within the bath of plating solution, connecting the conductive contact material to a cathode electrical potential, connecting an anode within the bath of plating solution to an anode electrical potential, and electrolytically plating the lead land of the semiconductor chip package.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Flat no-leads Integrated Circuit (IC) packages, such as DFN (Dual Flat No-leads) packages and QFN (Quad Flat No-leads) packages, are used to physically and electrically connect ICs to printed circuit boards. The term "flat no-leads" is used to describe surface-mount technology allowing an IC to be connected to the surface of a Printed Circuit Board (PCB) without through-holes, and so on. Leadless connections/terminals (lead lands) and an exposed thermal pad are typically provided on the bottom of a flat no-leads IC package for connecting the package to a PCB. The lead lands are generally positioned at the perimeter of the package bottom, while the exposed thermal pad is located in the center of the package bottom, between the lead lands. Individual flat no-leads packages may be formed together, molded, and plated in a block format on a panel, and then singulated into separate devices after fabrication (e.g., by sawing or punching the packages out of the panel).

Figure 1:
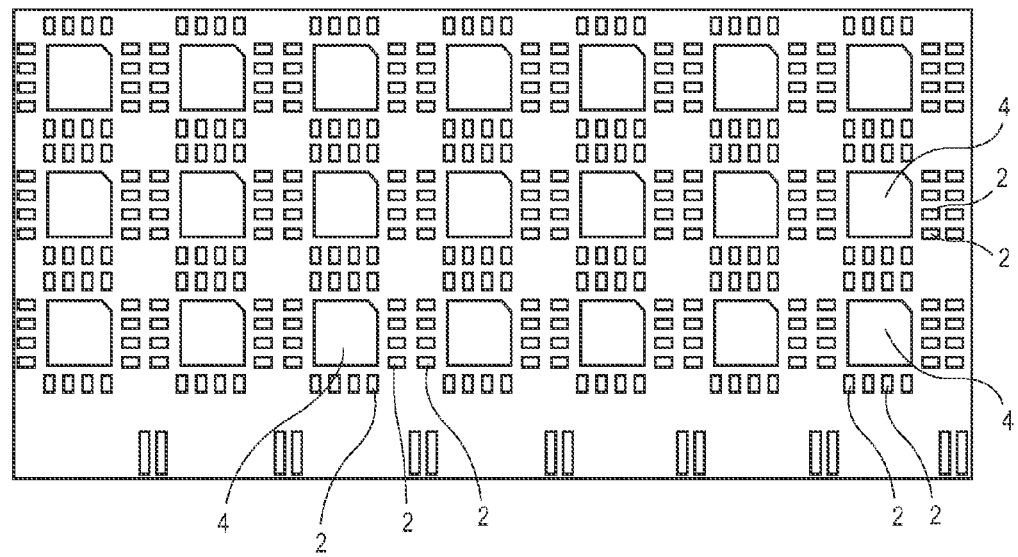
FIG. 1 is a bottom plan view illustrating a block format panel on which multiple QFN IC packages have been formed in an array, where exposed thermal pads and bottom land portions on the panel have been solder dipped or otherwise plated with a solder wettable material prior to singulation into individual devices.

Referring now to FIG. 1, a number of QFN devices are shown formed together in a matrix/array prior to singulation into individual pieces. In this example, each QFN package is formed with four lead lands 2 on each side of an individual IC package. Prior to singulation, the exposed lead lands 2 and an exposed thermal pad 4, which may be formed of copper or other conductive materials, may be solder dipped or otherwise plated with a solder wettable material, such as tin, a tin/lead alloy, gold, and/or another solder wettable material. The solder wettable material may be used to achieve a good bond between solder and the underlying conductive material, and to inhibit oxidation of the lead lands.

Figure 2:
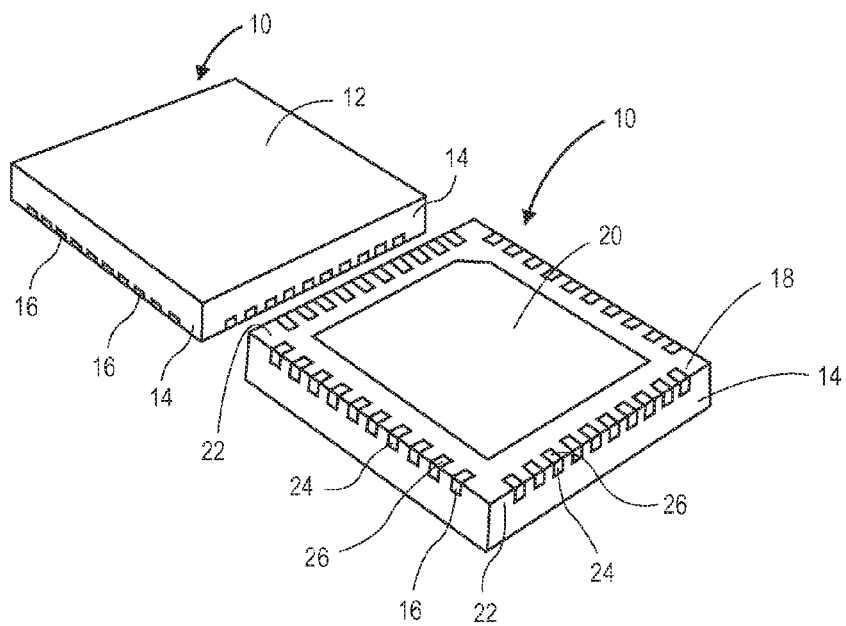
FIG. 2 is a perspective view illustrating two QFN IC packages that have been singulated during a block format manufacturing process after exposed thermal pads and bottom land portions have been solder dipped or otherwise plated with a solder wettable material.

Referring now to FIG. 2, a QFN IC package 10 is shown that has been singulated during the manufacturing process. The QFN device 10 has a top side surface 12, comprising a generally planar square or rectangular surface, and a number of adjacent sides 14. On each side flank 14, perimeter lead lands 16 are exposed. The QFN IC package 10 also has a bottom side surface 18, which includes an exposed thermal pad 20 formed from a thermally conductive material to dissipate heat from an IC in the package. The perimeter lead lands 16 extend from the sides 14 of the package onto a perimeter area about a bottom edge 22 of the package. Thus, each perimeter lead land 16 has a side land portion 24 and a bottom land portion 26.

Figure 3A:
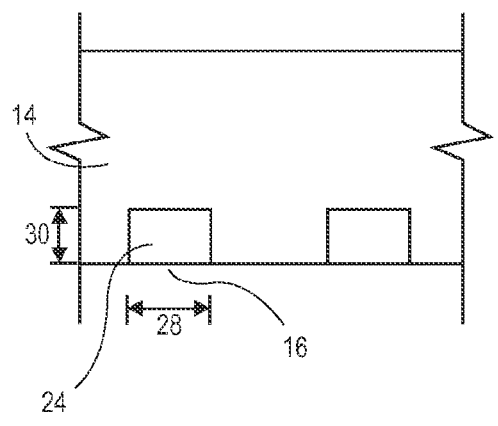
FIG. 3A is a partial side elevation view illustrating unplated side land portions of a singulated flat no-leads IC package formed as part of an array.
Figure 3B:
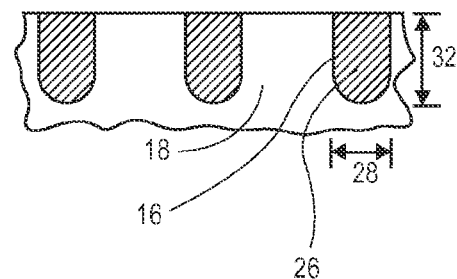
FIG. 3B is a partial bottom plan view illustrating plated bottom land portions of a singulated flat no-leads IC package formed as part of an array.

Referring now to FIGS. 3A and 3B, unplated side land portions 24 and plated bottom land portions 26 of perimeter lead lands 16 are shown. In a specific instance, side land portions 24 and bottom land portions 26 may have a width 28 ranging from approximately fifteen one hundredths of a millimeter (0.15 mm) to approximately four tenths of a millimeter (0.4 mm). The width of the side land portion 24 and the bottom land portion 26 may be substantially the same or within three tenths of a millimeter (0.3 mm) from one another. A side land portion 24 may have a height 30 ranging from approximately one tenth of a millimeter (0.1 mm) to approximately three tenths of a millimeter (0.3 mm). A bottom land portion 26 may have a length 32 ranging from approximately four tenths of a millimeter (0.4 mm) to approximately seven tenths of a millimeter (0.7 mm). However, these dimensions are provided by way of example only. For example, the length and width of a bottom land portion 26 may be determined by the pitch (spacing) of the bottom land portions about the perimeter of a QFN IC package, which can vary in different configurations.

Generally, the QFN IC package 10 is formed on a panel (e.g., as described above) and a solder wettable material is applied to the exposed thermal pad 20 and the exposed portions of the perimeter lead lands 16 on the panel prior to singulation. With this type of fabrication technique, the bottom land portions 26 of the perimeter lead lands 16 have the solder wettable material applied thereupon. However, due to singulation, the side land portions 24 will not be coated or plated with solder wettable material. Thus, in this type of configuration, the side land portions 24 on the side flanks 14 may be subject to oxidation and/or diminished solderability. For example, the side land portions 24 may be formed of exposed copper, which may oxidize and leave the side flanks inconsistently solderable when using a lightly activated "no clean" flux soldering process, and so on.

While an aggressive/highly active flux can be used to disrupt or dissolve the resulting metal oxides that may form on the side land portions 24, the corrosive nature of the flux may limit the product life of the QFN IC package 10. Moreover, when a PCB is manufactured, it is desirable to inspect soldered joints, such as soldered connections between the lead lands of a QFN IC package and the PCB, using visual camera inspection for quality control. For example, visual camera inspection may be less expensive than an inspection technique like X-ray inspection. However, when a QFN IC package lacks oxidation protection on the side lands or flanges, it may be difficult to analyze QFN soldered joints due to inconsistent wettability, wicking, or fillet formation created at the peripheral lands.

Accordingly, a semiconductor chip package is provided that has solderable or solder wettable side land portions around the periphery of the chip package. In embodiments, the solderable surface is created on the exposed side flanks of a chip package after singulation of the package in a block format manufacturing process, and so on. Thus, a solderable interface can be created on an inconsistently solderable material, such as an oxidized copper side flank, that may be the result of a cutting or punching operation during a manufacturing/fabrication process. The resulting side land portions provide high reliability and/or easy to inspect solder joints by providing a side flank surface for solder to wick up. Further, this type of chip package can provide a smaller and less expensive form factor, and may be used in industries including, but not limited to, medical, military, automotive, industrial, and other markets (e.g., where there is a need for long-lived products). In some instances, the semiconductor chip package can be configured as a DFN-type package. In other instances, the semiconductor chip package can be configured as a QFN-type package. However, these configurations are provided by way of example only, and are not meant to be restrictive of the present disclosure. Thus, the semiconductor chip package may be implemented with other configurations.

A method for providing a semiconductor chip package, such as a DFN-type package or a QFN-type package, with side wettable plating includes singulating a semiconductor chip package from an array of packages formed in a block format, immersing the semiconductor chip package in a bath of plating solution, contacting a lead land of the semiconductor chip package with conductive contact material within the bath of plating solution, connecting the conductive contact material to a cathode electrical potential, connecting an anode within the bath of plating solution to an anode electrical potential, and electrolytically plating the lead land of the semiconductor chip package. A conductive tape includes a metalized backing, an adhesive disposed on the metalized backing, and a plurality of conductive particles embedded in the adhesive, the plurality of conductive particles electrically connected to the metalized backing. The conductive tape can also include a plurality of singulated semiconductor chip packages formed on the adhesive as an array of packages in a block format.

Example Implementations

FIGS. 4 through 12 illustrate Integrated Circuit (IC) packages having side wettable plating in accordance with example implementations of the present disclosure. As shown, an IC package includes perimeter lead lands which have side land portions located on one or more side flanks of the IC package. Referring to FIG. 4A, a side-wettable no-leads package 150 is described. The no-leads package 150 includes an integrated circuit 152 in thermal contact with a heat sink, die-attach-pad, or central thermal pad 154. Connection wires 156 are conductively bonded between the integrated circuit 152 and a perimeter lead land 158. A molding compound 168 can be used to electrically and physically separate the perimeter lead lands 158 and the thermal pad 154. The exterior surfaces of each perimeter lead land 158 are plated with a solder wettable material 162, such that the solder wettable material 162 substantially covers the bottom surface portion 164 and outer side surface portion 166 of each perimeter lead land 158. The solder wettable plating also substantially covers the bottom exterior surface of the central thermal pad 154. In embodiments, the plating is reasonably uniform in thickness across the perimeter lead land 158 and central thermal pad 154 surfaces. The plating 162 provides both bottom and side-wettable surfaces on each perimeter lead land 158 of the no-leads package 150. A cover formed from the molding compound 168 can be used to cover the top side of the perimeter lead lands 158, thermal pad 154, as well as the integrated circuit 152 and bonding wires 156. It should be noted that the side-wettable no-leads package 150 is provided by way of example only, and that there are various package configurations other than the herein depicted IC packages that can be used to produce a side-wettable no-leads package. For example, techniques described in the present disclosure can be applied to QFN and DFN packages, and the like.

Figure 4A:
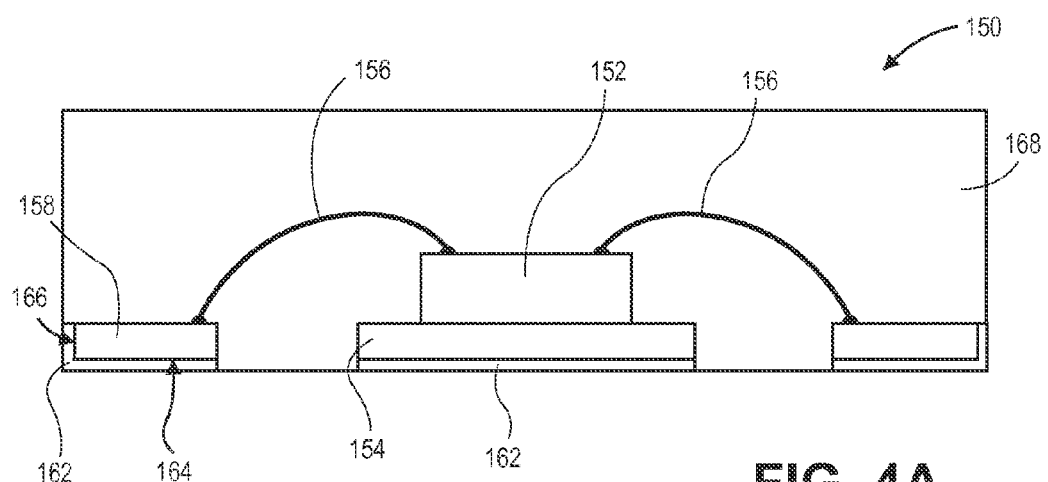
FIG. 4A is a partial cross-sectional side elevation view illustrating a side-wettable no-leads integrated circuit device in accordance with an example implementation of the present disclosure.
Figure 4B:
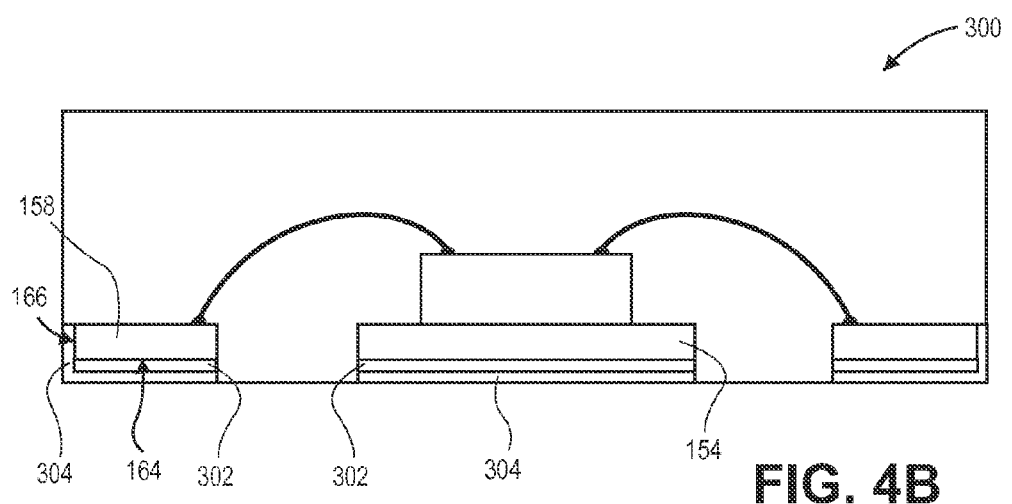
FIG. 4B is a partial cross-sectional side elevation view illustrating another side-wettable no-leads integrated circuit device in accordance with an example implementation of the present disclosure.

Referring now to FIG. 4B, a side-wettable no-leads IC package 300 is described, where the bottom conductive surfaces of the perimeter lead lands 158 and the thermal pad 154 have been coated, plated, or otherwise covered with a solder wettable material prior to being singulated. As such, a first or pre-existing solder wettable layer 302 substantially covers the bottom surfaces 164 of the perimeter lead lands 158 and, in embodiments, the thermal pad 154. An additional solder wettable plated layer 304 substantially covers the exposed exterior side portions 166 of each perimeter lead land 158, as well as the first layer 302 on the bottom portion of the perimeter lead lands 158 and the thermal pad 154. By providing a solder wettable plating on the side land portions as well as the bottom land portions of each perimeter lead land of a no-leads package, each land, when soldered to a PC board, has a configuration for wicking the solder such that a solder fillet is created underneath the bottom land portion and smoothly extends or wicks up the side land portion. This type of solder joint can be more easily inspected using visual techniques rather than more expensive x-ray techniques.

Figure 5:
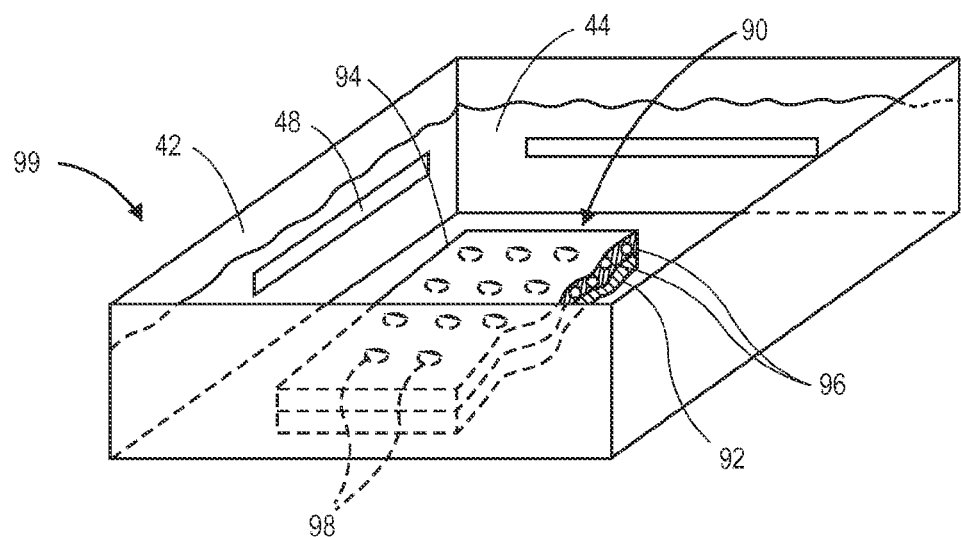
FIG. 5 is a diagrammatic view illustrating a plating bath for plating perimeter lead lands of an IC package in accordance with an example implementation of the present disclosure.

Referring to FIG. 5, a solder plating bath 99 is described. The solder plating bath 99 includes a tray 42, which may comprise any container or area that may be used to contain a plating solution 44. The plating solution 44 may be a commercially available solution comprising dissolved ions of one or more target plating materials, such as tin ions, lead ions, gold ions, and/or other metals/conductive materials that are dissolved in an electrolyte. Positioned near the bottom of the tray 42 is conductive tape 90 forming conductive contact material. The conductive tape 90 includes a metalized backing 92, such as a backing formed from a metalized aluminum material, and so on. An adhesive 94 containing conductive particles 96 is applied to the metalized backing 92. For example, the adhesive 94 may contain particles or flakes of silver, gold, or other conductive materials, such as conductive polymers and/or carbon-based polymers.

Together, the adhesive 94 and the conductive particles 96 form a conductive adhesive, a conductive polymer, a conductive gel, or conductive grease that is electrically connected to the metalized backing 92. In some instances, the conductive tape 90 may include surface features 98, such as dimples or bumps that are at substantially the same height, or are substantially in the same plane. The surface features 98 may be formed in an array or another formation. For example, the surface features 98 may be randomly placed on the conductive tape 90. In other instances, the conductive tape 90 may have a substantially smooth surface.

Figure 6:
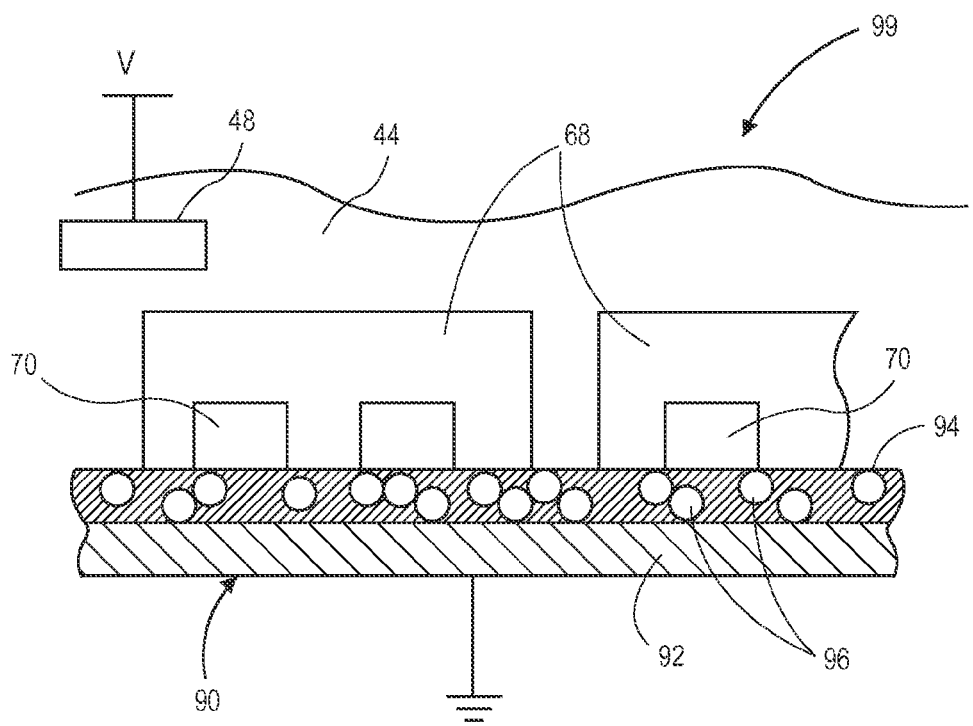
FIG. 6 is a partial cross-sectional side elevation view illustrating a plating bath and a number of IC packages having perimeter lead lands affixed to a conductive tape in accordance with an example implementation of the present disclosure.

Referring now to FIG. 6, an anode 48 may also be provided such that it is submerged below the surface of the plating solution 44 a predetermined distance above the conductive tape 90. In embodiments, the tray 42 may be a conductive tray formed of a conductive metal or another conductive material, and the adhesive 94 and the conductive particles 96 may be applied thereupon. A no-leads package 68, having perimeter lead lands 70 may be placed into the plating solution 44 of the solder plating bath 99. In embodiments, bottom land portions of the perimeter lead lands 70 may already be coated with a tin, a tin/lead alloy, or another solder wettable coating. In other embodiments, both side land portions and bottom land portions of the perimeter lead lands 70 may not have been previously coated with a solder wettable material. The conductive particles 96 are configured to make contact with the lead lands 70 of the no-leads package 68 so that the lead lands are at the same electrical potential. For example, the conductive tape 90 may be applied to bottom and/or side land portions of the no-leads package 68, and the metalized backing 92 may be connected to ground, such that the conductive particles 96 can act as a cathode during a plating process.

When a voltage is applied to anode 48, metallic ions in the plating solution 44 will move along electric field lines between the anode 48 and the cathode/conductive particles 96 and attach or deposit themselves to the cathode or any metal of cathode potential. Since the perimeter lead lands 70 are in a conductive relationship with the cathode/conductive particles 96, the perimeter lead lands also act as a cathode/ion target attracting the electric field lines. Thus, metallic ions may substantially uniformly plate both bottom and side surfaces of the perimeter lead lands 70. It should be noted that after the plating process is completed, conductive particles 96 separated from the adhesive 94 may be reclaimed from the plating solution 44. Further, etchants and/or solvents may be utilized to clean the adhesive 94 off the no-leads package 68.

In one or more embodiments, the conductive tape 90 supports a plurality of semiconductor chip packages formed on the adhesive as an array of packages (e.g., in a block format manufacturing process). Further, the conductive tape may be configured to stretch while maintaining electrical contact between the metalized backing 92 and the plurality of conductive particles 96 embedded in the adhesive 94. For example, when a panel of no-leads IC packages is adhered to the conductive tape 90, the panel may be singulated into individual devices while still maintaining the lead lands at the same electrical potential through adherence to the adhesive 94 and connection to the conductive particles 96.

Figure 7:
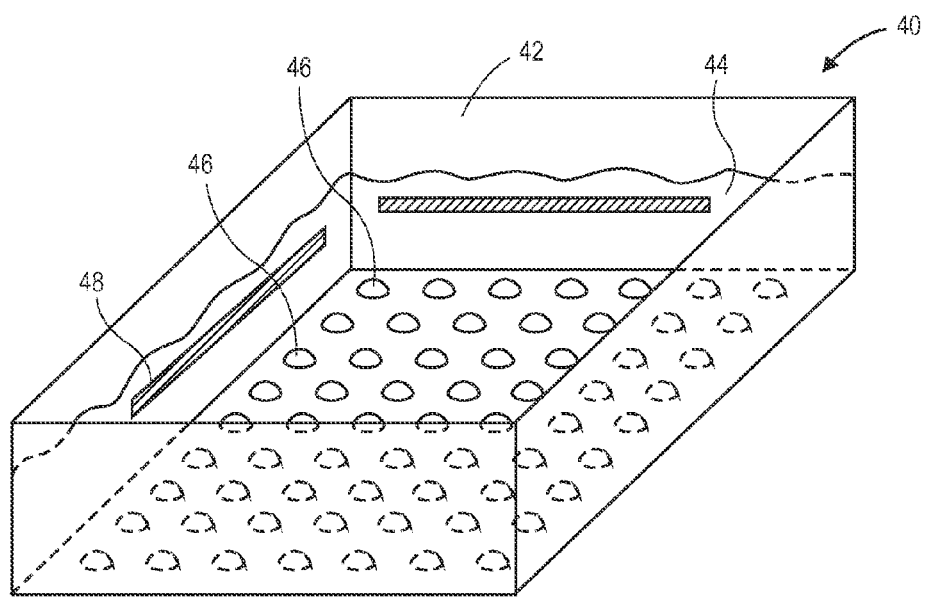
FIG. 7 is a diagrammatic view illustrating a plating bath for plating perimeter lead lands of an IC package in accordance with an example implementation of the present disclosure.

Referring to FIG. 7, a solder plating bath 40 is described. The solder plating bath 40 includes a tray 42, which may comprise any container or area that may be used to contain a plating solution 44 in a manufacturing environment, or another type of environment. The plating solution 44 is held within the tray 42. The plating solution 44 may be a commercially available solution comprising dissolved ions of one or more target plating materials, such as tin ions, lead ions, gold ions, and/or other metals/conductive materials that are dissolved in an electrolyte. Extending or protruding from the bottom of the tray 42 are a number of bumps/sockets 46 of conductive contact material. Each bump 46 is made of a conductive material, such as titanium, gold, or another durable, conductive material. The top or peaks of the bumps are at substantially the same height, or are substantially in the same plane. The bumps 46 may be organized in an array or another formation. The bumps 46 may also be randomly placed about the surface of the bottom of the tray 42.

The bumps 46 are configured to make contact with the bottom land portions of a no-leads IC package. The bumps 46 may be half spheres, cylindrical, cube-shaped, cone-shaped, or another geometric shape that allows each bump 46 to extend substantially an equal distance above the bottom of the tray 42. In some instances, the bumps 46 may have a cross-sectional width of between approximately two one hundredths of a millimeter (0.02 mm) and approximately twenty-five one hundredths of a millimeter (0.25 mm). In some instances, the bumps 46 may be small enough in size and placement such that a number of bumps 46 may touch a single bottom land portion of a no-leads package when such no-leads package is placed or pressed against the bottom of the tray 42. Each bump 46 is connected to the other bumps such that the bumps 46 have the same electrical potential. In embodiments, the bumps 46 may be formed on a screen, a mesh, or another flat-structured device that is removably placed on the bottom of tray 42. In embodiments, an anode 48 may be positioned on one or more inside walls of the box or tray 42. In other embodiments, the anode 48 may be removably placed or submerged within the plating solution 44 while a no-leads package bottom and side land portions are being plated.

Figure 8:
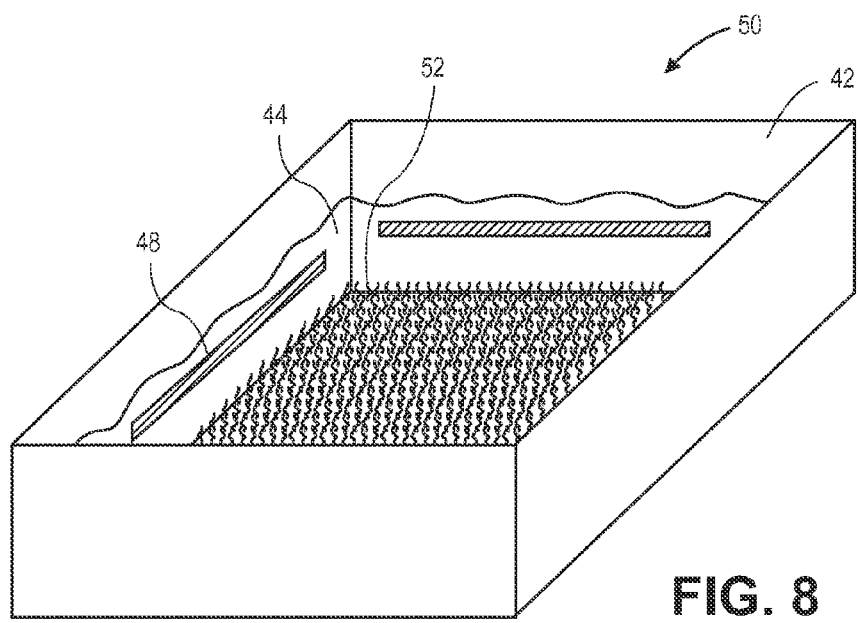
FIG. 8 is a diagrammatic view illustrating another plating bath for plating perimeter lead lands of an IC package in accordance with an example implementation of the present disclosure.

Referring now to FIG. 8, a solder plating bath 50 is described. The solder plating bath 50 is similar to the solder plating bath 40, except that the solder plating bath 50 has stems/hair-like structures 52 of conductive contact material extending up from the bottom of the tray 42. The conductive stems 52 may be formed from, for example, titanium wool or another conductive metal that may be used in a solder plating bath. In embodiments, the conductive stems 52 may comprise conductive filaments or fibers. The stems 52 are submerged under a plating solution 44. The stems 52 are connected such that they are at the same voltage potential. An anode 48 may also be provided such that it is submerged below the surface of the plating solution 44 above the stems/hair-like structures 52.

In embodiments, the tray 42 may be a conductive tray formed of a conductive metal or another conductive material and incorporate the stems 52 or bumps 46 therein. In embodiments, the tray 42 may not be conductive and/or the bumps 46 or stems 52 may either be connected to a common mesh or submergible structure that rests or attaches to the bottom of tray 42, or they may be installed or attached to the top surface of the bottom of tray 42.

Figure 9:
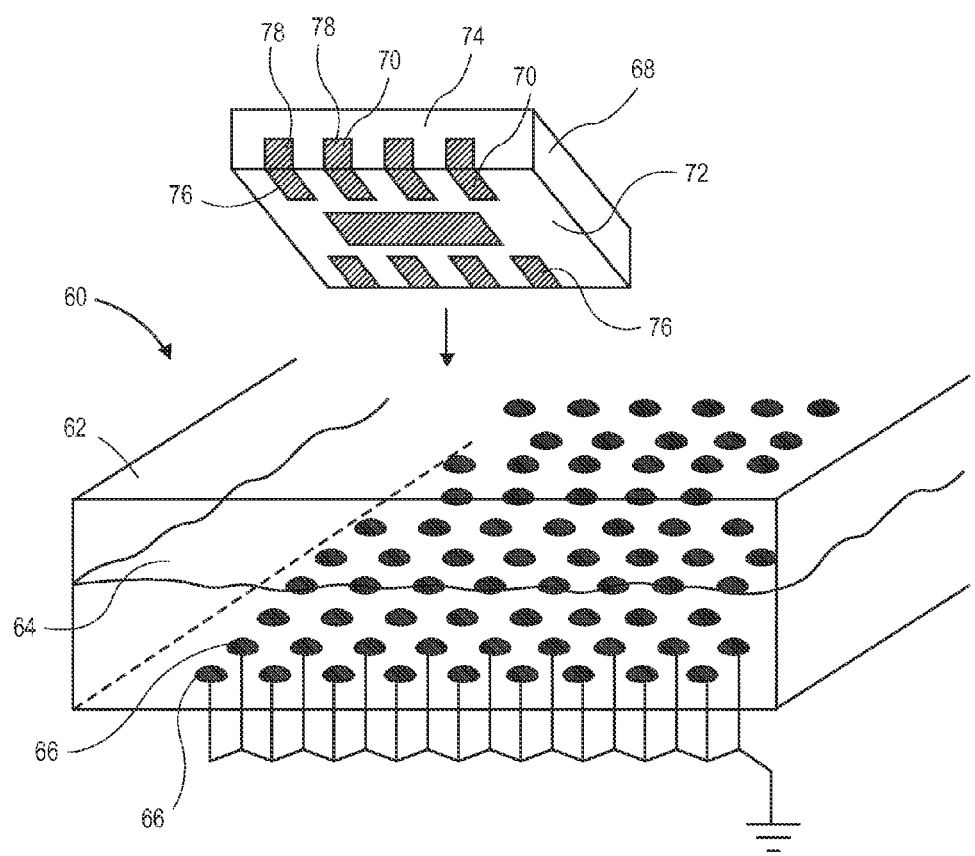
FIG. 9 is a diagrammatic view illustrating a plating bath and an IC package having perimeter lead lands in accordance with an example implementation of the present disclosure.

Referring to FIG. 9, a solder plating bath 60 including a tray 62 with a plating solution 64 filling at least a portion of the tray 62 is described. Conductive bumps 66 of a conductive contact material are located substantially at or near the bottom of the tray 62. The bumps 66 may be incorporated into a separate structure resting or installed at the bottom of the tray 62, or may be part of or attached to the tray 62. The conductive bumps 66 are each connected to ground such that they can act as a cathode during a plating process. A no-leads package 68, having perimeter lead lands 70 positioned about its bottom surface 72 and on at least one side surface 74 of the no-leads package, may be placed into the plating solution 64 of the solder plating bath 60. In embodiments, the bottom land portions 76 of the perimeter lead lands 70 may already be coated with a tin, a tin/lead alloy, or another solder wettable coating. In embodiments, both the side land portions 78 and the bottom land portions 76 of the perimeter lead lands 70 may not have been previously coated with a solder wettable material.

Figure 10:
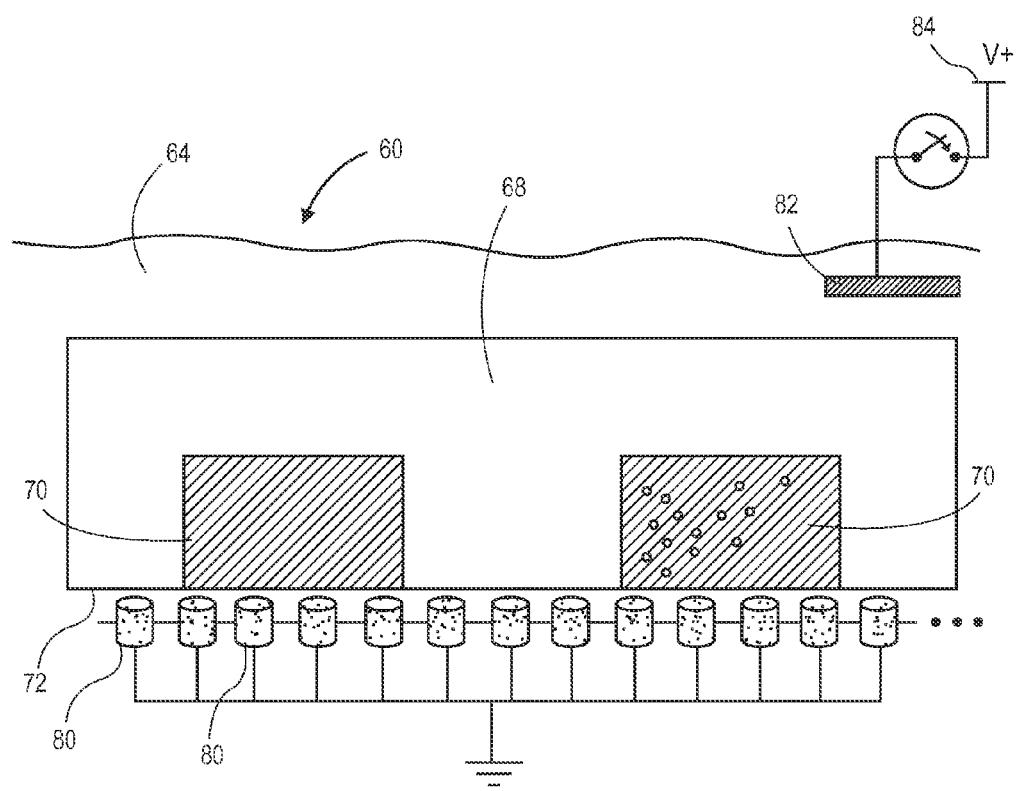
FIG. 10 is a partial cross-sectional side elevation view illustrating a plating bath and an IC package having perimeter lead lands in accordance with an example implementation of the present disclosure.

Referring now to FIG. 10, a no-leads IC package 68 is submerged under the plating solution 64 within a solder plating bath 60. The bottom 72, including the perimeter lead lands 70, of the no-leads package 68 is in electrical contact with a number of conductive bumps 80, which are each held at or near the bottom of the solder plating bath and electrically connected to a ground or cathode potential. An anode 82 is provided within the plating solution 64. The anode 82 is switchably connected to a predetermined voltage 84. When the predetermined voltage is applied to anode 82, metallic ions in the plating solution 64 will move along electric field lines between the anode 82 and the cathode/conductive bumps 80 and attach or deposit themselves to the cathode or any metal of cathode potential. Since the perimeter lead lands 70 are in a conductive relationship with the cathode/conductive bumps 80, the perimeter lead lands also act as a cathode/ion target attracting the electric field lines. Thus, metallic ions may substantially uniformly plate both the bottom and side surfaces 76 and 78 of the perimeter lead lands 70.

Figure 11:
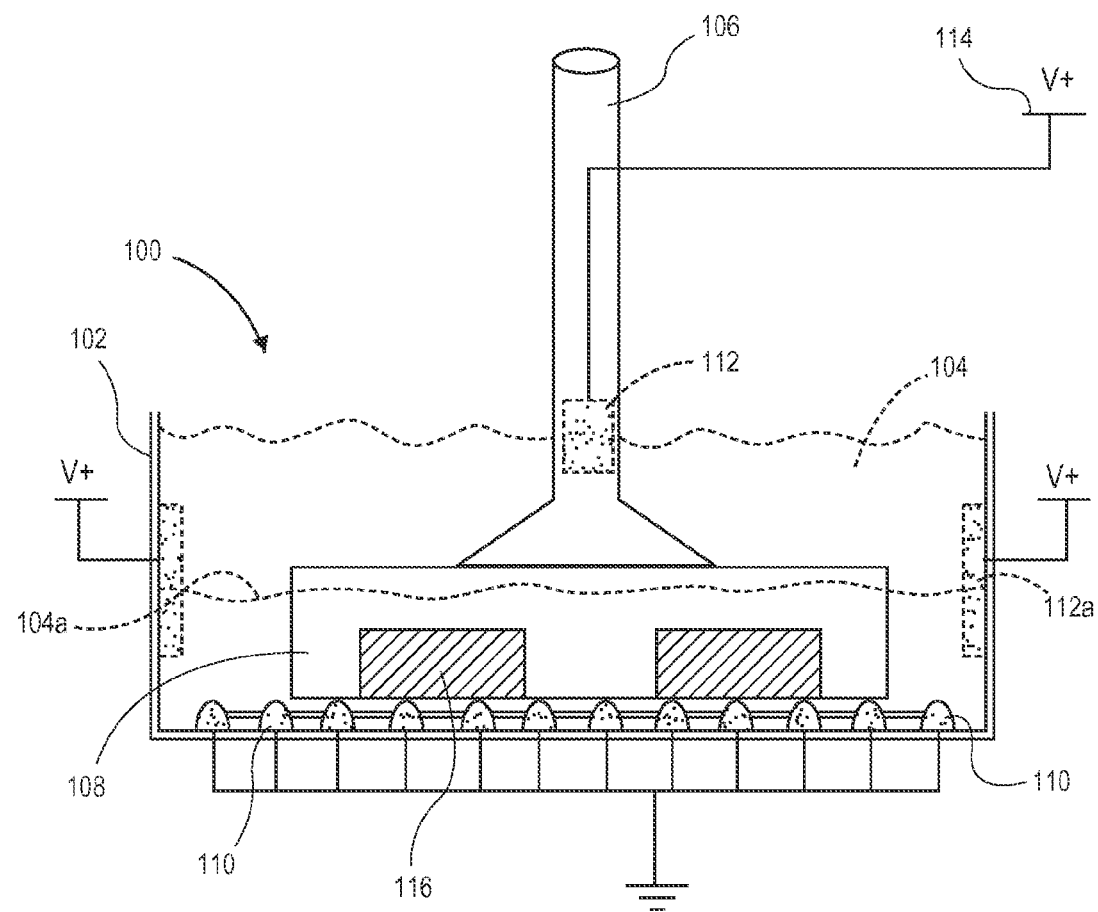
FIG. 11 is a partial cross-sectional side elevation view illustrating another plating bath and an IC package having perimeter lead lands in accordance with an example implementation of the present disclosure.

Referring to FIG. 11, a no-leads IC package 108 with perimeter lead lands 116 plated with solder wettable material in a solder plating bath 100 is described. The solder plating bath 100 includes a tray 102 that is partially filled with a plating solution 104. A vacuum collet 106 may be used to pick up a no-leads device 108 using vacuum/suction, and then place the no-leads device 108 into the solution 104. The vacuum collet 106 may press the no-leads device against a number of conductive bumps or other conductive contact material, such as nodules, stems, hair-like structures, a woven conductive screen or submerged structure 110 (herein referred to as "conductive bumps"), such that each perimeter lead land 116 is in conductive contact with at least one conductive bump 110. The collet 106 or other device used to collect and submerge the no-leads device 108 may have an anode 112 attached thereto. The anode 112 can be attached or placed on the collet 106 such that when the collet submerges the no-lead device 108, the anode 112 will also be partially or completely submerged in the plating solution 104.

Once submerged, an anode voltage 114 is applied to the anode 112. Electric field lines form between the anode 112 and the conductive bumps 110, which are grounded. Since some of the conductive bumps 110 are in conductive contact with the perimeter lead lands 116, electric field lines also extend between the anode 112 and the side and bottom land portions or surfaces of the perimeter lead lands 116. If the no-leads device 108 also has a conductive surface (e.g., a thermal heat sink) in the central area of the bottom of the no-leads device package, then this conductive surface will also have electric field lines extending thereto. Plating will occur on the target cathode areas of the conductive bumps 110, the surfaces of the perimeter lands 116, and, in embodiments, the central conductive surface or heat sink on the bottom of the no-leads package 108.

In embodiments, a no-leads package may not be completely submerged under the plating solution, as shown in FIG. 11 by plating solution level 104a. In this type of configuration, anodes 112a may be placed about the walls or about an edge of a submerged no-leads package so long as the anode 112a is also either partially or completely submerged in the plating solution. Regardless of the placement of the anodes 112 or 112a, plating will occur along the electric field lines from the anode 112, 112a toward the cathode, where the cathode is the target of the dissolved ion plating materials. Since the perimeter lead lands 116 are in conductive contact with the conductive bumps 110, both the side and bottom surfaces of the perimeter lands may acquire a substantially uniform solder wettable plated coating from the deposited metal ions originating from within the plating solution 104.

Figure 12:
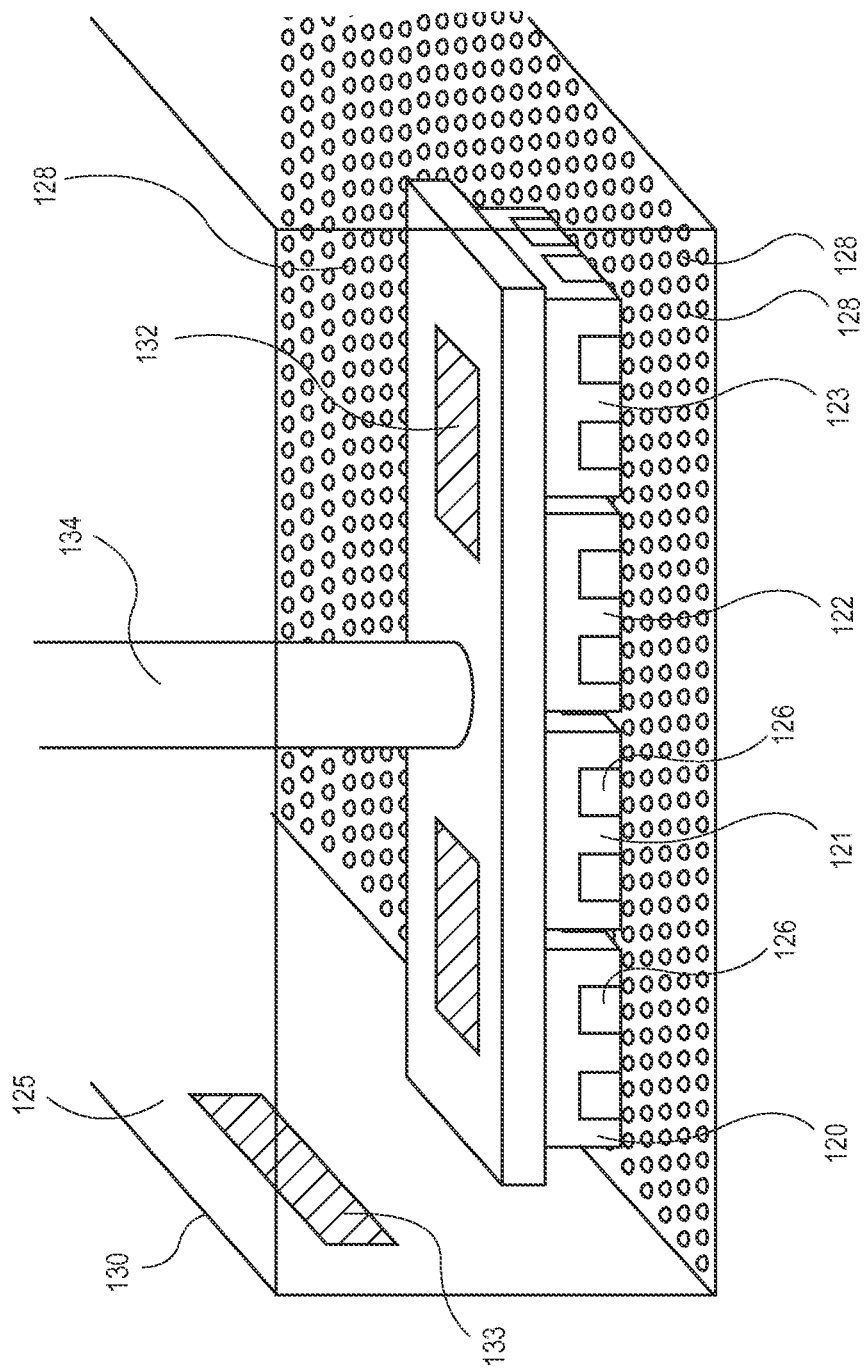
FIG. 12 is a partial cross-sectional side elevation view illustrating a plating bath for simultaneously plating a number of IC packages having perimeter lead lands in accordance with an example implementation of the present disclosure.

Referring now to FIG. 12, a number of no-leads packages 120, 121, 122 and 123 are described, where the IC packages are simultaneously dipped in a solder plating bath 125, such that the perimeter lead lands 126 of the no-leads packages are each pressed against conductive bumps 128 located at or near the bottom of a plating solution tray 130. One or more anodes 132 may be positioned on the vacuum tube, collet, turret, package holding device 134 or other multi-part carrier and provide electric field lines that run close to and about the surface and perimeter lead lands 126 of the no-leads packages 120, 121, 122, and 123. In embodiments, one to at least approximately five hundred (500) singulated no-leads packages can be dipped in a single solder plating bath 125 at the same time. However, in other embodiments, more than five hundred packages can be dipped in a solder plating bath. It should be noted that additional anodes 133 can be placed within a solder plating bath and about the no-lead packages 120, 121, 122 and 123.

Example Fabrication Process

Figure 13A:
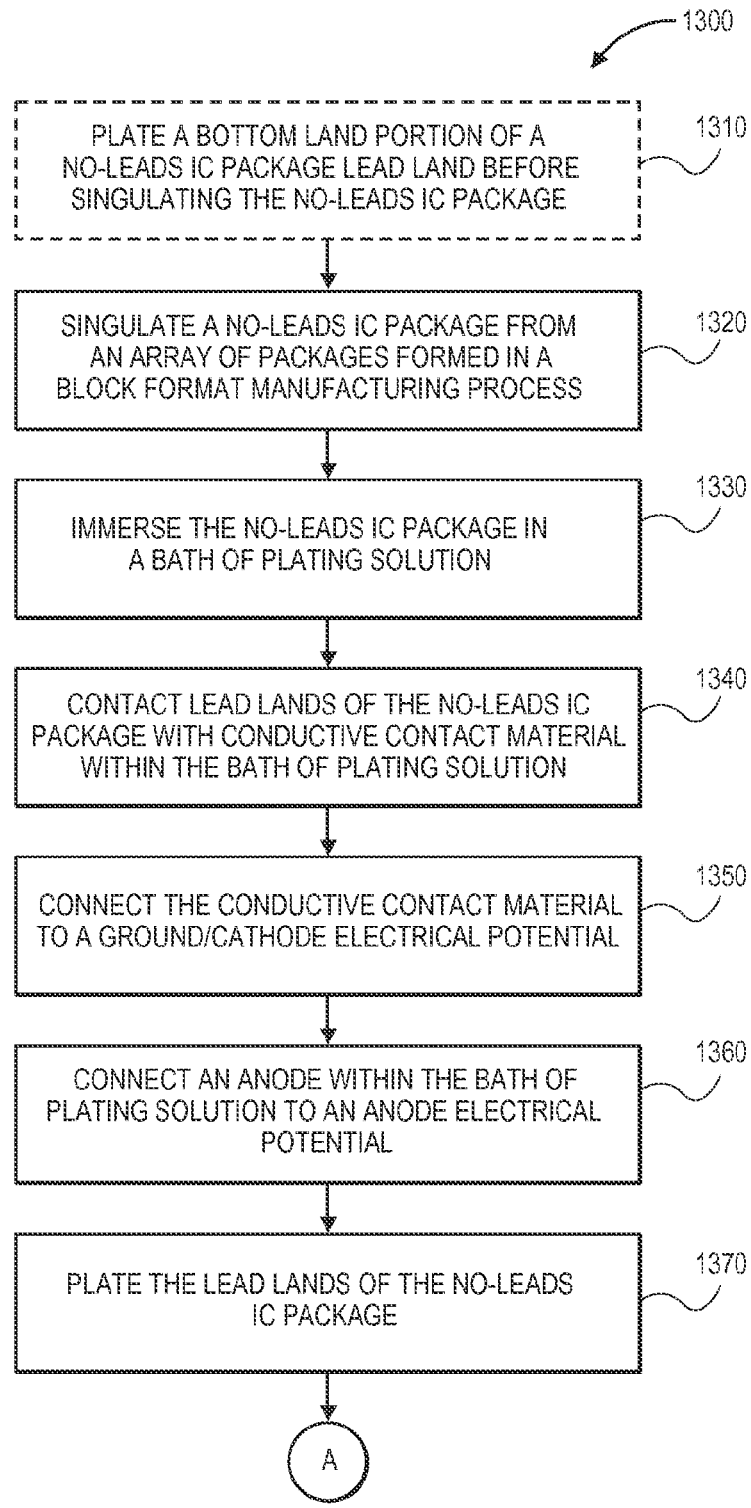
FIGS. 13A and 13B are a block diagram illustrating a method for plating perimeter lead lands of a no-leads IC package in accordance with an example implementation of the present disclosure.
Figure 13B:
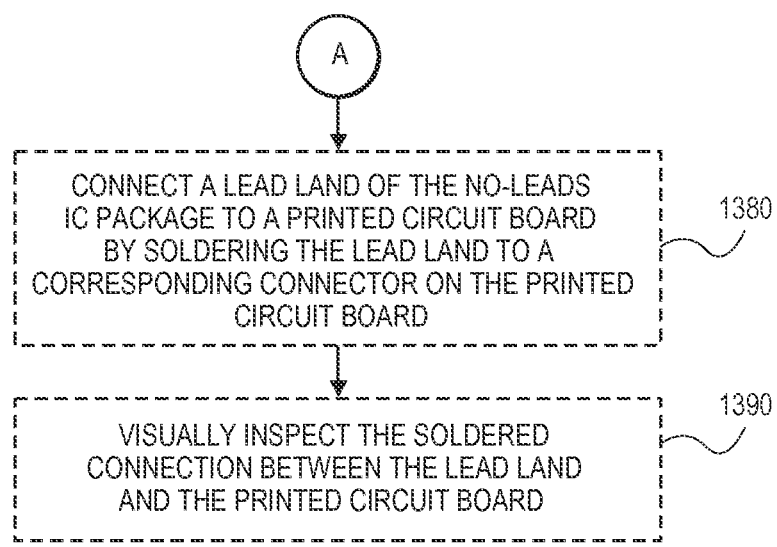

The following discussion describes example techniques for fabricating an integrated circuit device having side wettable plated lead lands, such as a side wettable DFN or QFN semiconductor chip package, and so on. FIGS. 13A and 13B depict a process 1300, in an example implementation, for fabricating an integrated circuit device, such as the example integrated circuit devices 68, 108, 120, 121, 122, 123, 150, and 300 illustrated in FIGS. 4 through 12 and described above. In the process 1300 illustrated, a no-leads IC package is singulated from an array of packages formed in a block format manufacturing process (Block 1320). In embodiments, the no-leads IC package has perimeter lead lands including one or more exposed side land portions. For example, with reference to FIGS. 4 through 12, a no-leads IC package 68 may have perimeter lead lands 70 including side land portions 78 exposed on one or more side flanks thereof. The perimeter lead lands 70 may extend from the side surface 74 of the package onto a perimeter area about the bottom surface 72 of the package, to form bottom land portions 76.

Another no-leads IC package 108 may have perimeter lead lands 116 exposed on one or more side flanks thereof. Further no-leads IC packages 120, 121, 122, and 123 may have perimeter lead lands 126 exposed on one or more side flanks thereof. Other no-leads IC packages 150 and 300 may have perimeter lead lands 158 exposed on one or more side flanks thereof. Perimeter lead lands 116, 126, and 158 may extend from the side surfaces of their respective IC packages onto a perimeter area about the bottom surface of the packages to form bottom land portions, as previously described. In embodiments, a surface of the bottom land portions may be exposed conductive material used to form a perimeter lead land (e.g., as illustrated in FIG. 4A). In other embodiments, the bottom land portions may be coated, plated, or otherwise covered with solder wettable material prior to singulation (e.g., as illustrated in FIG. 4B) (Block 1310).

Next, the singulated no-leads IC package is partially or fully immersed into a bath of plating solution (Block 1330). In some implementations, singulated IC packages may be organized into stacks, container tubes, or other storage configurations, such that the IC packages can be dispensed for plating the perimeter lead lands. The IC packages can be dispensed singly (e.g., as illustrated in FIGS. 9 through 11) or in groups (e.g., as illustrated in FIGS. 6 and 12). When the IC packages are dispensed, they may be picked up and positioned using equipment including a vacuum suction component and/or a collet. Further, the IC packages can be loaded into a turret, a rack, and/or another type of holding device such that they can be moved as a group. However, techniques for moving and positioning singulated IC packages are provided by way of example only, and are not meant to be restrictive of the present disclosure. Thus, a variety of other techniques can be used to position the IC packages.

With continuing reference to FIGS. 4 through 12 described above, the integrated circuit devices 68, 108, 120, 121, 122, 123, 150, and 300 may be partially or fully immersed in a bath of plating solution, such as solder plating baths 40, 50, 60, 99, 100, and 125. Lead lands of the no-leads IC package (and in some cases an exposed thermal pad) are contacted with conductive contact material within the bath of plating solution (Block 1340). For example, with continuing reference to the integrated circuit devices 68, 108, 120, 121, 122, 123, 150, and 300 described above, bottom land portions of a singulated IC package can be contacted with conductive bumps 46, 66, 80, 110, and 128, conductive hair-like structures 52, conductive tape 90, and the like. The peripheral lead lands are placed or pressed into contact with the conductive contact material. The conductive contact material is connected to a ground or cathode electrical potential (Block 1350). Thus, the lead lands of the IC package are set to the cathode or ground potential via contact with the conductive contact material. An anode within the bath of plating solution is connected to an anode electrical potential (Block 1360). The electric potential is applied via the anode to the plating solution to create electric field lines from the anode to the lead lands that are at cathode potential.

In this manner, the lead lands of the no-leads IC package are electrolytically plated (Block 1370). Metal ions dissolved in the plating solution are deposited on both the side land portions and bottom land portions of the various perimeter lead lands submerged in the plating solution and in contact with the conductive contact material. After some amount of time, the electrical potential from the anode can be removed, and/or the IC package can be removed from the bath of plating material. In embodiments, the no-leads IC package can remain immersed in the bath of plating solution for varying amounts of time, depending on desired plating thickness. For example, in some specific instances, plating the lead lands may take from approximately one minute (1 min) to approximately five minutes (5 min). In other instances, plating may take less than one minute (e.g., several seconds) or more than five minutes. Further, the amount of plating can vary depending upon plating solution temperature and/or other parameters associated with a plating solution. Also, the voltage applied to the anode can vary depending upon a particular plating solution/electrolyte composition. For example, in some specific instances, an anode voltage may be between approximately four volts (4 V) and approximately twenty volts (20 V).

In some instances, a tin, tin/lead alloy, or other solder wettable plating can be applied to the lead lands, where the plating material has a plating thickness of between approximately the molecular thickness of the plating material to approximately five hundred millionths of an inch (500 μin). It should be noted that the plating material may be substantially smooth and of a nearly consistent thickness across the surfaces of the perimeter lead lands and possibly the exposed thermal pad. However, there may be some surface irregularities where the conductive contact material (such as the conductive bumps 46, 66, 80, 110, and 128, the dimples 98, and/or the conductive hair-like structures 52) contacts the lead lands/thermal pad. The resulting solder wettable plating can help prevent oxidation of the copper or other metal underneath the plating, increase the solderability of the IC package, and allow for accurate visual inspection of the solder joints between the IC package and a PCB, and so on.

With continuing reference to FIGS. 4 through 12 described above, the IC package can be removed from the bath of plating solution using, for example, collet 106 or package holding device 134. The IC package can then be cleaned/rinsed of plating solution, e.g., using deionized water for example, or another rinsing technique. The IC package can then be dried in preparation for distribution. Multiple IC packages can be stored in containers such as storage tubes, boxes, tape reels, and can be organized and collected using other electronic part distribution techniques. These groups of IC packages can be shipped to device vendors, electronics manufacturers, end users, and the like.

It should be noted that over time, conductive contact material within a bath of plating solution, such as the conductive bumps 46, 66, 80, 110, and 128, and the conductive hair-like structures 52, may become plated with plating material as it forms from the ions within the plating solution. When the conductive contact material becomes caked with plating material, the conductive contact material can be cleaned of the plating material. For example, the conductive contact material can be submersed in an acid bath, which may require some additional scrubbing. In this type of implementation, the conductive contact material may be comprised of a hard, conductive metallic material, such as titanium, to withstand the acid and scrubbing process without significant erosion of conductive surfaces. However, other conductive contact materials such as gold or gold alloys can be used as well. In this type of implementation, an etching or cleaning process may remove some of the metal from the conductive contact material. In other instances, the conductive contact material can be heated to melt off the plating material. Further, plating material may be removed from the conductive contact material in other ways, using other types of cleaning, etching, heating techniques, and the like.

Once fabrication of the IC package has been completed, the IC package can be connected to a PCB by soldering lead lands of the IC package to a corresponding connector on the PCB (Block 1380). For example, one or more lead lands on an IC package can be soldered to one or more connection pads on a PCB. When the IC package is connected to the PCB, the soldered connections between lead lands of the IC package and the PCB can be inspected using a visual inspection technique (Block 1390). For example, when side land portions of the IC package are plated, there is a good probability of wicking the solder such that a solder fillet is created underneath the bottom land portion and smoothly extends or wicks up the side land portion. This type of configuration may be more easily inspected using a visual inspection technique, such as camera inspection, and so on.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A system, comprising:
   a metalized backing;
   an adhesive disposed on the metalized backing;
   a plurality of conductive particles embedded in the adhesive, the plurality of conductive particles electrically connected to the metalized backing; and
   a semiconductor chip package in contact with the plurality of conductive particles embedded in the adhesive and electrically connected to the metalized backing, wherein the metalized backing and the semiconductor chip package are electrically connected to a ground.

2. The system as recited in claim 1, wherein the adhesive and the plurality of conductive particles comprise at least one of a conductive adhesive, a conductive polymer, a conductive gel, or a conductive grease.

3. The system as recited in claim 1, wherein the conductive tape is configured to stretch while maintaining electrical contact between the metalized backing and the plurality of conductive particles embedded in the adhesive.

4. The system as recited in claim 1, further comprising:
   a plurality of semiconductor chip packages formed on the adhesive as an array of packages in a block format.

5. The system as recited in claim 4, wherein the plurality of semiconductor chip packages are singulated.

6. The system as recited in claim 1, wherein the conductive tape is dimpled.

7. The system tape as recited in claim 4, wherein each one of the plurality of semiconductor chip packages comprises a lead land having a bottom land portion connected to the metalized backing via the plurality of conductive particles embedded in the adhesive.

8. A method comprising:
   contacting a semiconductor chip package with a conductive tape, the conductive tape including a metalized backing, an adhesive disposed on the metalized backing, and a plurality of conductive particles embedded in the adhesive, the plurality of conductive particles electrically connected to the metalized backing; and
   removing the conductive tape from the semiconductor chip package in its entirety.

9. The method as recited in claim 8, wherein the adhesive and the plurality of conductive particles comprise at least one of a conductive adhesive, a conductive polymer, a conductive gel, or a conductive grease.

10. The method as recited in claim 8, wherein the conductive tape is configured to stretch while maintaining electrical contact between the metalized backing and the plurality of conductive particles embedded in the adhesive.

11. The method as recited in claim 8, further comprising:
contacting a plurality of semiconductor chip packages with the conductive tape, wherein the plurality of semiconductor chip packages are formed as an array of packages in a block format.

12. The method as recited in claim 11, wherein the plurality of semiconductor chip packages are singulated.

13. The method as recited in claim 11, wherein each one of the plurality of semiconductor chip packages comprises a lead land having a bottom land portion connected to the metalized backing via the plurality of conductive particles embedded in the adhesive.

14. The method as recited in claim 8, wherein the conductive tape is dimpled.

* * * * *